(12) United States Patent
Tsuji et al.

(10) Patent No.: US 7,298,855 B2
(45) Date of Patent: Nov. 20, 2007

(54) VOLUME CIRCUIT USING RESISTIVE LADDER CIRCUITS

(75) Inventors: Nobuaki Tsuji, Hamamatsu (JP); Hisatoshi Uchida, Iwata-gun (JP)

(73) Assignee: Yamaha Corporation, Hamamatsu-shi (JP)

(*) Notice: Subject to any disclaimer, the term of this patent is extended or adjusted under 35 U.S.C. 154(b) by 527 days.

(21) Appl. No.: 10/174,884

(22) Filed: Jun. 19, 2002

(65) Prior Publication Data
US 2003/0044027 A1 Mar. 6, 2003

(30) Foreign Application Priority Data
Jun. 22, 2001 (JP) ............................. P2001-189677

(51) Int. Cl.
*H03G 3/00* (2006.01)
(52) U.S. Cl. ...................................... 381/104; 330/284
(58) Field of Classification Search ........ 381/104–109, 381/102, 120, 94.5; 330/284, 69, 251, 254, 330/125 R
See application file for complete search history.

(56) References Cited

U.S. PATENT DOCUMENTS

| | | | | |
|---|---|---|---|---|
| 3,207,848 A | * | 9/1965 | Bore | ........................... 381/107 |
| 4,267,550 A | * | 5/1981 | Cecil | ........................... 340/347 |
| 5,138,665 A | * | 8/1992 | Ito | ............................... 381/104 |
| 5,233,309 A | * | 8/1993 | Spitalny et al. | ................ 330/84 |
| 5,969,658 A | * | 10/1999 | Naylor | ......................... 341/154 |
| 6,127,893 A | * | 10/2000 | Llewellyn et al. | ........... 330/284 |
| 6,147,558 A | * | 11/2000 | Sculley | ......................... 330/284 |
| 6,448,856 B2 | * | 9/2002 | Noro et al. | .................. 330/284 |

FOREIGN PATENT DOCUMENTS

| | | |
|---|---|---|
| JP | 05-327509 | 12/1993 |
| JP | 11-068488 | 3/1999 |
| JP | 11-330362 | 11/1999 |
| JP | 2001-217660 | 8/2001 |
| TW | 09220929010 | 9/2003 |

OTHER PUBLICATIONS

Korean Patent Office, Office Action, (Feb. 28, 2006).

* cited by examiner

*Primary Examiner*—Vivian Chin
*Assistant Examiner*—Lao Lun-See
(74) *Attorney, Agent, or Firm*—Pillsbury Winthrop Shaw Pittman LLP

(57) ABSTRACT

A volume circuit contains resistive ladder circuits, from which a desired fractional voltage output (Vs) is extracted and supplied to an amplifier to provide an output voltage (Vout). The resistive ladder circuits comprise multiple lines of series resistances, wherein each line contains a resistance portion 'nR' (where 'n' denotes a division index, and 'R' denotes an element resistance) that is connected in parallel with a next line, so that an overall resistance of following lines is '(n−1)×n' times larger than the element resistance. Secondary resistive ladder circuits can be additionally arranged in series in order to control a secondary amplifier that absorbs excessive currents flowing into the resistive ladder circuits. The secondary resistive ladder circuits are constituted symmetrically with the resistive ladder circuits, in which output terminals (t1-t12) are all set to the same potential.

18 Claims, 11 Drawing Sheets

VOLUME CIRCUIT USING RESISTIVE LADDER CIRCUITS

BACKGROUND OF THE INVENTION

1. Field of the Invention

This invention relates to volume circuits that use resistive ladder circuits for adjustments of audio signals in volume levels.

2. Description of the Related Art

In the fields of audio devices and technologies, electronic volume circuits for fabricating electronic circuits are conventionally used for adjustments of volumes in audio signals. Japanese patent application No. 2000-28152 (i.e., Japanese Unexamined Patent Publication No. 2001-217660; and U.S. patent application Ser. No. 09/773,646) disclosed an example of an electronic volume circuit that is driven by a single power source and whose components are fabricated together as LSI circuitry.

In the aforementioned electronic volume circuit, the gain (or attenuation) of an input signal is controlled by selecting a tap (or a voltage division point) from series resistance. In particular, when the gain is greatly narrowed down, resistance division points should be extremely reduced in resolutions when selected. Therefore, it is difficult to accurately and sufficiently narrow down the gain of an input signal in a conventional electronic volume circuit.

SUMMARY OF THE INVENTION

It is an object of the invention to provide a volume circuit having a high resolution in controlling and narrowing down the gain of an input signal by introducing various improvements in circuit configurations. That is, the volume circuit uses a resistive voltage divider circuit, which can provide a desired tap voltage in a high resolution. In addition, a resistive current control circuit coupled with the resistive voltage divider circuit is designed to eliminate unwanted influences on the output line resistance of the resistive voltage divider circuit.

In a first aspect of the invention, a volume circuit comprises resistive ladder circuits (or resistive networks) and a switch circuit. The resistive ladder circuits provide parallel arrangements of lines of series resistances, which are arranged between terminals IN and OUT, wherein each line has a resistive element realizing a resistance that is 'n' (where 'n' is an integer not less than '2') times larger than an element resistance 'R'. Herein, one line having the resistance 'nR' is connected in parallel with another line having series resistance that is '(n−1)×n' times greater than the element resistance 'R', so that the overall resistance of the following lines in view of one line having the resistance 'nR' is equal to '(n−1)×nR'. The switch circuit operates to extract a 'desired' fraction of the overall voltage applied to the resistive ladder circuits via a desired tap selected from among taps that are linearly arranged with respect to the resistive ladder circuits.

Specifically, each line contains a first resistive element that is not at all connected in parallel with a next line, and a second resistive element that is connected in parallel with a certain resistive element of the next line. Various taps are arranged along the first resistive element of each line, so that numerous taps are linearly arranged along different lines of resistive ladder circuits. Therefore, the switch circuit selects a desired tap from among these taps so as to extract a desired fraction of the overall voltage applied to the resistive ladder circuits as a fractional voltage output. In addition, the second resistive element of each line is connected in parallel with a part of the next line in connection with the 'common' terminal OUT. As described above, numerous resistive elements are connected in series and parallel with each other within the resistive ladder circuits, wherein each of them is actualized by various units of the element resistance 'R'.

An amplifier is used to amplify a fractional voltage output that is extracted from the resistive ladder circuits by the switch circuit. All the aforementioned components (i.e., the resistive elements, switch circuit, and amplifier) are fabricated together on the semiconductor substrate or board.

In a second aspect of the invention, a volume circuit comprises combinations of resistive ladder circuits and amplifiers. That is, the first unit of resistive ladder circuits are actualized by multiple lines of series resistances arranged between terminals IN and OUT, wherein each line is connected in parallel with a part of the next line in connection with the 'common' terminal OUT. The fractional voltage output extracted from the resistive ladder circuits is supplied to the amplifier, which in turn provides an amplified output to the terminal OUT. In addition, an input terminal of a secondary amplifier is connected to the terminal OUT, and the second unit of resistive ladder circuits is inserted between the terminal OUT and the output terminal of the secondary amplifier.

The second unit of resistive ladder circuits is actualized by multiple lines of resistive elements, wherein all or a part of resistive elements of one line is connected in parallel with the next line in connection with the 'common' terminal OUT. Specifically, the second unit of resistive ladder circuits provides substantially the symmetrical circuit configuration compared with the first unit of resistive ladder circuits with respect to the terminal OUT.

In the resistive ladder circuits, each line has a resistance that is 'n' times larger than the element resistance 'R' and is connected in parallel with the next line. The total resistance of the following line(s) in view of one line having the resistance 'nR' is '(n−1)×n' times greater than the element resistance 'R'. All the aforementioned components (i.e., the resistive ladder circuits and amplifiers) are fabricated together on the semiconductor substrate or board.

BRIEF DESCRIPTION OF THE DRAWINGS

These and other objects, aspects, and embodiments of the present invention will be described in more detail with reference to the following drawing figures, in which:

FIG. 7A shows a terminal portion of the resistive ladder circuits R1 in the side of the terminal IN;

DESCRIPTION OF THE PREFERRED EMBODIMENTS

This invention will be described in further detail by way of examples with reference to the accompanying drawings.

First Embodiment

Figure 1:
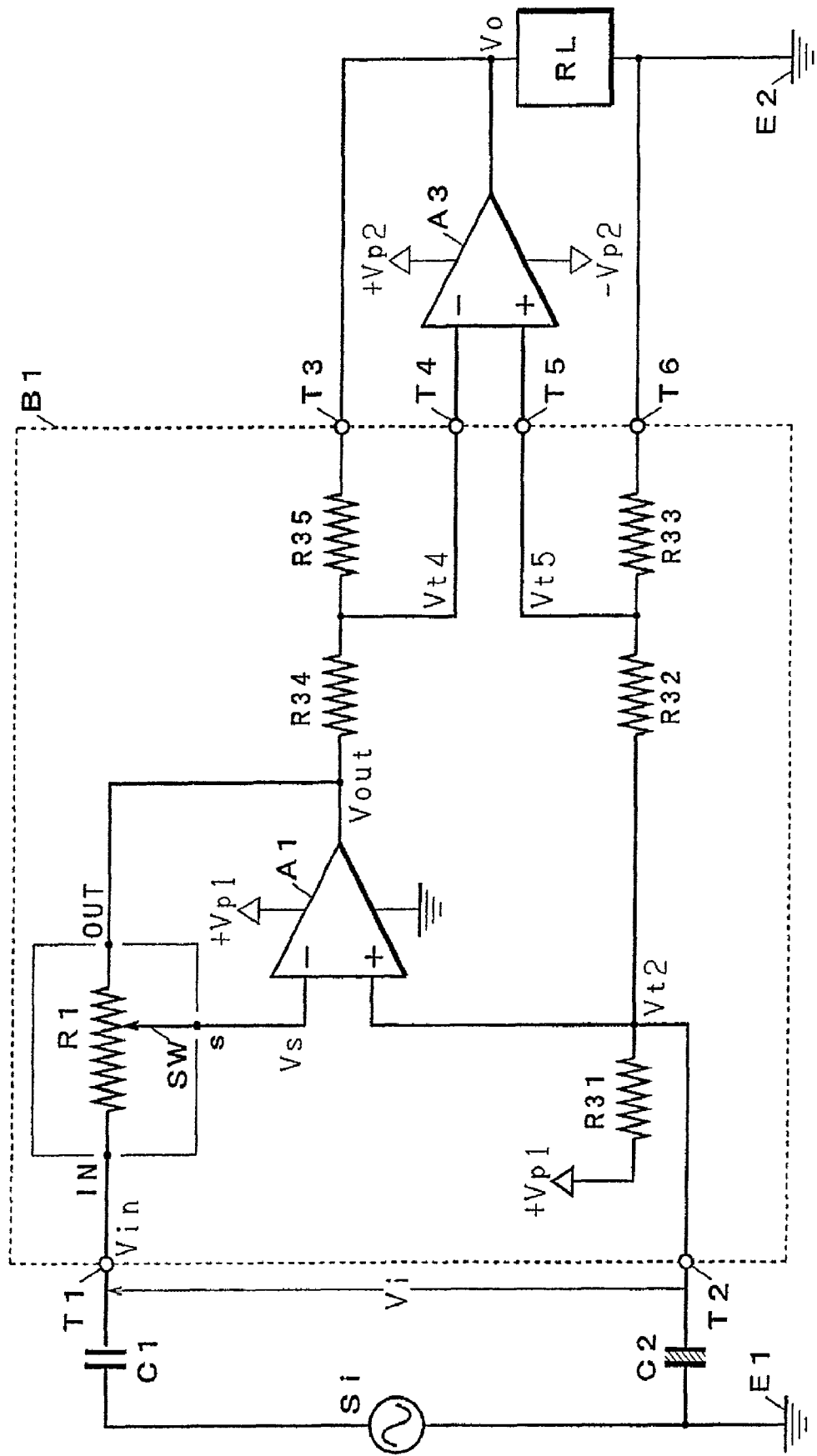
FIG. 1 is a circuit diagram showing the overall configuration of an electronic volume circuit in accordance with a first embodiment of the invention.

FIG. 1 shows the overall configuration of an electronic volume circuit in accordance with the first embodiment of the invention. The volume circuit of FIG. 1 contains an LSI circuit 'B1' (encompassed by dotted lines), which provides a voltage divider realized by resistive ladder circuits R1, a switch circuit SW, an inversion-type operation amplifier A1 that operates by a single source voltage +Vp1, a series of resistors R31, R32, and R33 that are connected in series with a constant voltage source in order to gain a reference potential, and a series of resistors R34 and R35 that are used to output signals.

The LSI circuit B1 has two input terminals T1 and T2, and four output terminals T3 to T6. A capacitor C1 for cutting out dc current flowing therethrough is connected to the input terminal T1; and a capacitor C2 for stabilizing the input of the LSI circuit B1 is connected to the input terminal T2. Hence, an input signal source Si is connected between the input terminals T1 and T2 of the LSI circuit B1 via the capacitors C1 and C2, wherein it is grounded with one terminal of the capacitor C2 (see the earth 'E1'). A differential operational amplifier A3 that operates by bidirectional source voltages +Vp2 and -Vp2 is arranged externally of the LSI circuit B1, wherein the inverting input (-) terminal is connected to the output terminal T4, and the noninverting input (+) terminal is connected to the output terminal T5. In addition, a load RL is connected between the output terminal of the differential operational amplifier A3 and the output terminal T6, wherein the output terminal T6 is grounded (see the earth 'E2').

The input signal source Si provides an input signal voltage Vi (corresponding to ac signal components only), which is applied between the input terminals T1 and T2 of the LSI circuit B1 via the capacitors C1 and C2. In the LSI circuit B1, one terminal IN of the resistive ladder circuits R1 is connected to the input terminal T1, and the other terminal OUT is connected with the output terminal of the operational amplifier A1. FIG. 1 shows an equivalent circuit (i.e., series resistance) of the resistive ladder circuits R1. Actually, the resistive ladder circuits R1 comprise multiple lines of series resistances between the terminals IN and OUT. The switch circuit SW selects one of numerous taps (or voltage division points) that are linearly arranged along the resistive ladder circuits R1.

Figure 2:
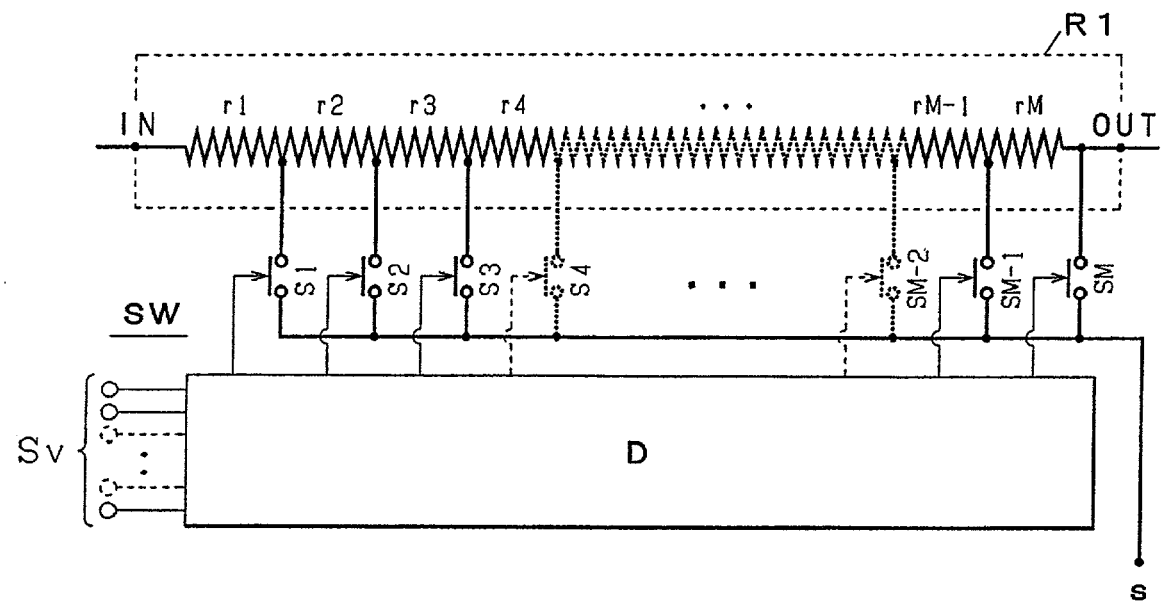
FIG. 2 is a circuit diagram showing electric connections between resitive ladder circuits and a switch circuit shown in FIG. 1.

FIG. 2 shows the relationships between the resistive ladder circuits R1 and the switch circuit SW, and it shows an equivalent circuit (i.e., series resistance) of the resistive ladder circuits R1. The resistive ladder circuits R1 have numerous taps, the number of which is denoted by 'M'. The switch circuit SW contains numerous switching elements 'Sm' (where 'm' denotes the tap or switch number, and m=1, 2, 3, . . . , M-1, M), which are inserted between the taps and the line used for the extraction of a fractional voltage output 's'. The switch circuit SW also has a decoder D for controlling the switching elements Sm respectively. Volume control data Sv given from the external circuit (not shown) are supplied to control terminals of the decoder D. That is, a specific switching element Sm is turned on in response to the value 'm' of the volume control data Sv, so that the voltage of the tap corresponding to the specific switching element Sm is output as the fractional voltage output 's'.

The fractional voltage output 's' that is provided from the tap selected by the switch circuit SW is supplied to the inverting input terminal of the operational amplifier A1. The resistive ladder circuits R1 operate in such a way that a specific potential Vs corresponding to the fractional voltage output s is set to a value ranging between potentials Vin and Vout at the terminals IN and OUT when the specific switching element Sm is turned on in response to the volume control data Sv. Herein, a specific division ratio 'ks' for 'Vs-Vout' (i.e., a voltage difference measured between the fractional voltage output s and the terminal OUT) against 'Vin-Vout' (i.e., a voltage difference measured between the terminals IN and OUT) is given by the following equation (1).

$$ks = \frac{Vs - Vout}{Vin - Vout} \tag{1}$$

Therefore, the ratio for 'Vs-Vout' against 'Vin-Vs' (i.e., a voltage difference measured between the terminal IN and the divided voltage output s) is given by the following equation (2).

$$\frac{Vs - Vout}{Vin - Vs} = \frac{ks}{1 - ks} \tag{2}$$

The input terminal T2 and the noninverting input terminal of the operational amplifier A1 are connected to the connection point between the resistors R31 and R32 that are connected in series. The other end of the resistor R31 is supplied with a source potential +Vp1, which corresponds to the aforementioned source voltage supplied to the operational amplifier A1. The other end of the resistor R32 is connected to the output terminal T6, which is grounded (see the earth 'E2'), via the resistor R33. The potential Vt2 of the input terminal T2 is given by the equation (3), wherein reference symbols Ra, Rb, and Rc designate resistances of the resistors R31, R32, and R33 respectively.

$$Vt2 = (+Vp) \times \frac{Rb + Rc}{Ra + Rb + Rc} \qquad (3)$$

$$Ra = Rb + Rc \qquad (4)$$

If the relationship between Ra, Rb, and Rc is defined by the equation (4), the potential Vt2 can be retained at the 'constant' reference potential, which approximately corresponds to half of the source voltage +Vp1 of the operational amplifier A1.

With respect to the input voltage Vi supplied from the input signal source Si, the output voltage Vout output from the operational amplifier A1 is given by the equation (5).

$$Vout = Vt2 - Vi \times \frac{ks}{1 - ks} \qquad (5)$$

The output of the operational amplifier A1 is connected to the output terminal T3 via the resistors R34 and R35 that are connected in series. The connection point between the resistors R34 and R35 is connected to the output terminal T4. Herein, the resistances of the resistors R34 and R35 are respectively set to Rb and Rc, which also designate resistances of the resistors R32 and R33. With respect to the maximal division ratio ksmax (i.e., the division ratio that is given when the switching element S1, providing the maximal level, is turned on in response to the volume control data Sv), it is preferable to provide the following relationship of the equation (6) for the resistances Rb and Rc.

$$\frac{Rb}{Rc} = \frac{ksmax}{1 - ksmax} \qquad (6)$$

The connection point between the resistors R32 and R33 is connected to the output terminal T5. It is retained at a certain voltage Vt5 that depends upon the resistances Ra, Rb, and Rc as well as the aforementioned voltage +Vp, which is applied to the series circuit consisting of the resistors R31, R32, and R33, in accordance with the following equation (7).

$$Vt5 = (+Vp) \times \frac{Rc}{Ra + Rb + Rc} \qquad (7)$$

The operational amplifier A3 operates based on the bidirectional source voltages +Vp2 and -Vp2, which realize the maximal amplitude of the input signal Si. With respect to the connections between the operational amplifier A3 and the LSI circuit B1 shown in FIG. 1, the output of the operational amplifier A3 is connected to the output terminal T3, and the inverting input terminal is connected to the output terminal T4.

Both the resistors R32 and R34 have the same resistance Rb, while both the resistors R33 and R35 have the same resistance Rc, wherein these resistances are related to each other by the following ratio K3.

$$K3 = \frac{Rc}{Rb} \qquad (8)$$

The operational amplifier A3 outputs at the output terminal T3 a load voltage Vo for the load RL, which is expressed by the following equation.

$$Vo = -K3 \times (Vout - Vt2) \qquad (9)$$

Next, concrete examples of numeric values for the aforementioned circuit configurations shown in FIGS. 1 and 2 will be described. The input signal Si is an audio signal that varies in amplitude in the maximal range of ±12V, for example. The comprehensive equivalent resistance of the resistive ladder circuits R1 between the terminals IN and OUT is approximately 12 kΩ. In FIG. 2, the volume control data Sv consist of eight bits, which express volume control levels in M=256 steps. These volume control levels can be expressed as the gain G by using the prescribed interval (e.g., 0.5 dB) therebetween, so that they are expressed as −16 dB, −16.5 dB, −17 dB, . . . , −143.5 dB, −∞ (mute), for example. In correspondence with these volume control levels, there are provided M=256 switching elements S1, S2, . . . , S255 (SM-1), and S256 (SM) as well as their taps. The gain G (dB) is expressed by the following equation.

$$G = 20 \times \log\left(\frac{Vs - Vout}{Vin - Vs}\right)$$

Therefore, a desired tap of the resistive ladder circuits R1 is selected by turning on the 'desired' switching element Sm in response to the level of the volume control data Sv, so that the potential of the selected tap is extracted as the fractional voltage output s. For example, when the volume control data Sv that chooses the level '256' realizing the maximal volume is input, the decoder D turns on the switching element S256 (SM) of the switch circuit SW, so that the terminal OUT of the resistive ladder circuits R1 provides the fractional voltage output s.

When the source voltage +Vp1 of the operational amplifier A1 is +5V, it can be said that the series circuit consisting of the resistors R31, R32, and R33 is connected between the voltage source of +5V (or +Vp1) and the earth (E2), wherein their resistances are selected such that Ra=11.59 kΩ, Rb=1.59 kΩ, and Rc=10 kΩ. In this case, the noninverting input terminal of the operational amplifier A1 (corresponding to the input terminal T2) is retained at a certain reference potential Vt2=+2.5V.

Suppose that the fractional voltage output s is supplied from the terminal OUT of the resistive ladder circuits R1 by way of the 256th switching element S256 (SM) wherein the gain G is set to −∞. In this case, the division ratio is minimized as ks=ksmin=0, so that the operational amplifier A1 provides the output voltage Vout=Vt2=2.5V. Suppose that the fractional voltage output s is supplied from the tap corresponding to the first level realizing the maximal gain by turning on the first switching element S1, wherein the gain G is set to −16 dB. In this case, the division ratio is maximized as ks=ksmax=0.137, so that the operational amplifier A1 provides the output voltage Vout as follows:

$$Vout = Vt2 + 0.159\ Vi = +2.5V + 0.159Vi$$

In the above, even though the input voltage Vi is varied in the maximal range of ±12V, it is possible to maintain the positive polarity in the output of the operational amplifier A1.

When Ra=11.59 kΩ, Rb=1.59 kΩ, and Rc=10 kΩ, the connection point (corresponding to the output terminal T5) between the resistors R32 and R33 is retained at a certain voltage Vt5=2.16V.

In correspondence with the input voltage Vi that is varied in the maximal range of ±12V, the bidirectional source voltages +Vp2 and −Vp2 applied to the operational amplifier A3 are respectively set to +12V and −12V. When the 256th switching element S256 is turned on by setting the minimal gain G=−∞ (where the division ratio is minimized as ks=ksmin=0), the operational amplifier A3 provides the load voltage Vo=0V. When the first switching element S1 is turned on by setting the maximal gain G=−16 dB (where the division ratio is maximized as ks=ksmax=0.137), the following equations are established.

$$K3 = \frac{Rc}{Rb} = 6.29$$

Vout=Vi2−0.159×Vi

Hence, the operational amplifier A3 provides the load voltage Vo in accordance with the foregoing equation (9).

$$Vo = -6.29 \times (-0.159 \times Vi) \quad (10)$$

In FIG. 2, the resistive ladder circuits R1 is a series circuit consisting of resistors r1, r2, r3, . . . , rM−1, and rM, wherein their connection points act as taps which are respectively connected with the switching elements S1, S2, S3, . . . , SM−1, and SM, each of which can be selected in providing the fractional voltage output s. In the case of M=256, it is possible to set the resistors r1 to rM to prescribed resistance values, which will be described below.

Suppose that the gain G is subjected to fine adjustment using the prescribed interval of 0.5 dB, for example, by precisely controlling the switching element S1 to SM. In this case, resistances should be sequentially reduced in order as r1=10365Ω, r2=80Ω, r3=76.7Ω, and r4=73.4Ω. In addition, in proximity to the minimal gain G, resistances should be extremely reduced as follows:

R253 (rM-3)=53.4 μΩ (−142.5 dB)
R254 (rM-2)=50.4 μΩ (−143 dB)
R255 (rM-1)=47.6 μΩ (−143.5 dB)
R256 (rM)=0.850 mΩ (−∞)

In general, a sheet resistance ranging from several ohms to several hundreds ohms can be precisely obtained by using the polysilicon or polyside for the LSI circuit. However, it may be unrealistic to form the resistive ladder circuits R1 using serial connections of resistors.

Next, the principle of the formation of a circuit configuration of a resistive ladder circuit will be described with reference to FIGS. 3A and 3B. This invention employs resistive ladder circuits using parallel connections of resistances, thus realizing fine divisions of resistances for use in fine adjustment of the volume.

For convenience' sake, the same symbol 'R' is used to designate the resistance of an element resistor; and 'n' designates a division index that is a natural number not less than '2'. Hence, 'nR' denotes a resistance that is 'n' times larger than the resistance 'R' of the element resistor. FIG. 3A shows a parallel circuit in which a resistance 'nR' is connected in parallel with series resistances realized by 'n−1' series of the resistance 'nR' (hereinafter, simply referred to as resistance series '(n−1)×nR'). FIG. 3B shows an equivalent circuit of the parallel circuit shown in FIG. 3A, which is a simple resistance circuit having a resistance '(n−1)R'.

Figure 3A:
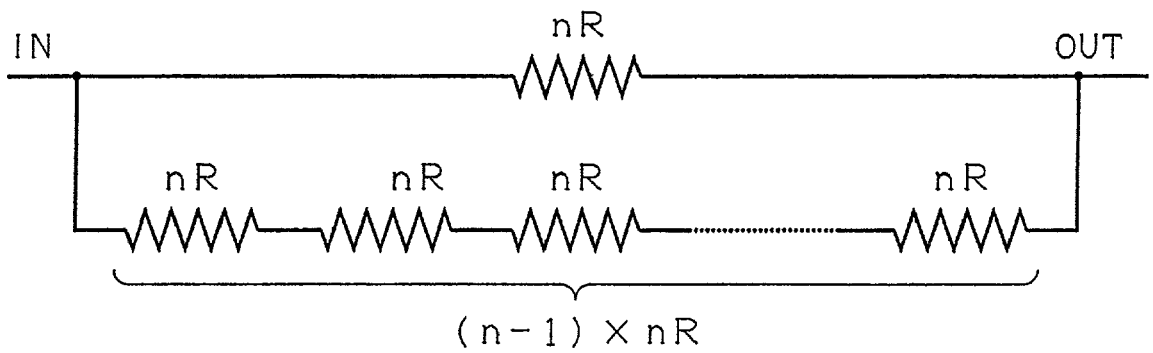
FIG. 3A shows an example of a circuit configuration forming a simple resistive ladder circuit.
Figure 3B:
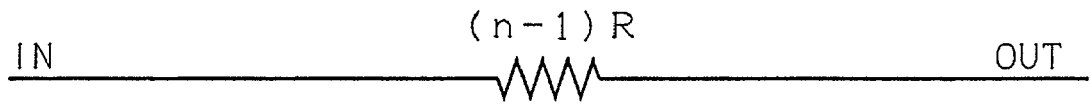
FIG. 3B shows an equivalent circuit of the resistive ladder circuit shown in FIG. 3A.

In other words, the comprehensive resistance (n−1)R that is assumed to be connected between terminals IN and OUT shown in FIG. 3B can be expanded in the form of a parallel circuit consisting of the resistance nR and the series resistances '(n−1)×nR' between terminals IN and OUT shown in FIG. 3A. Due to such expansion of the circuit configuration, it is possible to realize the comprehensive resistance (n−1)R while providing 'n' fine divisions of the overall voltage by the series resistances (n−1)×nR between the terminals IN and OUT. That is, it is possible to provide 'n' times smaller voltages compared with the overall voltage of the simple resistance (n−1)R shown in FIG. 3B. It is possible to provide further fine divisions of resistances by further dividing resistances with respect to an arbitrary number (<n) of series resistances '(n−1)R' arranged in the side of the terminal OUT within the series resistances (n−1)×nR, wherein a certain number of resistances remain without being further divided in the side of the terminal IN. By repeatedly performing the aforementioned resistance dividing operations a certain number of times, the resistive ladder circuits can be further expanded in a complex circuit configuration, which may provide further smaller divisions of voltages in proximity to the terminal OUT.

Suppose that the division index n is set to '3' while the comprehensive resistance is set to '2R', so that an original resistance circuit whose resistance is '2R' is subjected to expansion. The original resistance circuit is expanded by the aforementioned resistance dividing operation to produce a resistive ladder circuit in which a series of two resistances '3R' (simply referred to as a series resistance '6R') are connected in parallel with a resistance '3R'. Using the series resistance 6R, it is possible to provide three times smaller divisions of voltages compared with the overall voltage of the original resistance circuit having the resistance 2R. In the above, it is possible to provide a series of three resistances '2R', which are substituted for the series of two resistances '3R' in the resistive ladder circuit. In this case, two resistances 2R remain in the side of the terminal IN, while a resistance dividing operation is further performed with respect to one resistance 2R arranged in the side of the terminal OUT. By repeatedly performing this operation a certain number of times, it is possible to further expand the resistive ladder circuit in a complex circuit configuration.

Figure 4A:
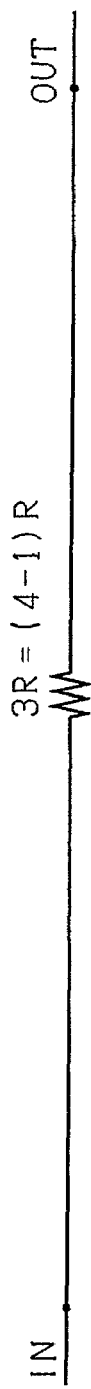
FIG. 4A shows an original single resistor circuit that is subjected to expansion.

Resistive ladder circuits are repeatedly expanded to ones, which will be described with reference to FIGS. 4A to 4C, and FIGS. 5A and 5B. Herein, the division index n is set to '4', and an original resistance circuit having a resistance '3R' shown in FIG. 4A is subjected to expansion. That is, a first resistance dividing operation is performed to produce a parallel circuit in which a series of three resistances '4R' (namely, a series resistance '12R') are connected in parallel with a resistance '3R', wherein the overall resistance of the parallel circuit is set to '3R'. The aforementioned series resistance 12R can be modified as shown in FIG. 4B, wherein a resistance '6R' arranged in the side of the terminal IN is connected in series with two resistances '3R' arranged in the side of the terminal OUT.

Figure 4B:
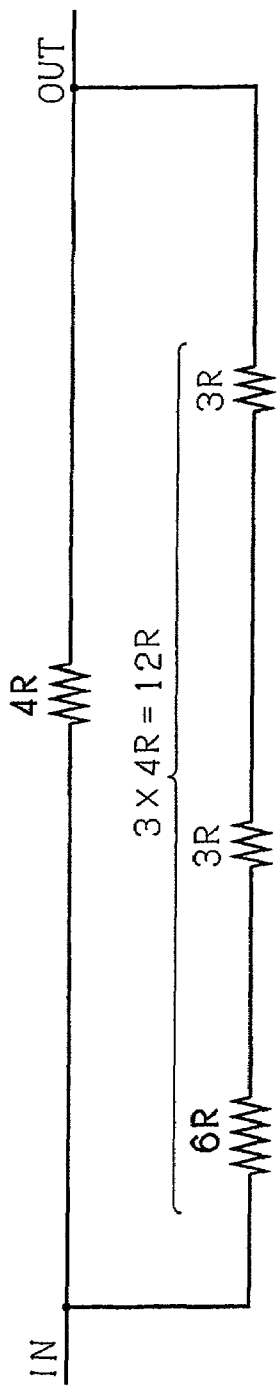
FIG. 4B shows a parallel circuit that is expanded based on the single resistor circuit shown in FIG. 4A.
Figure 4C:
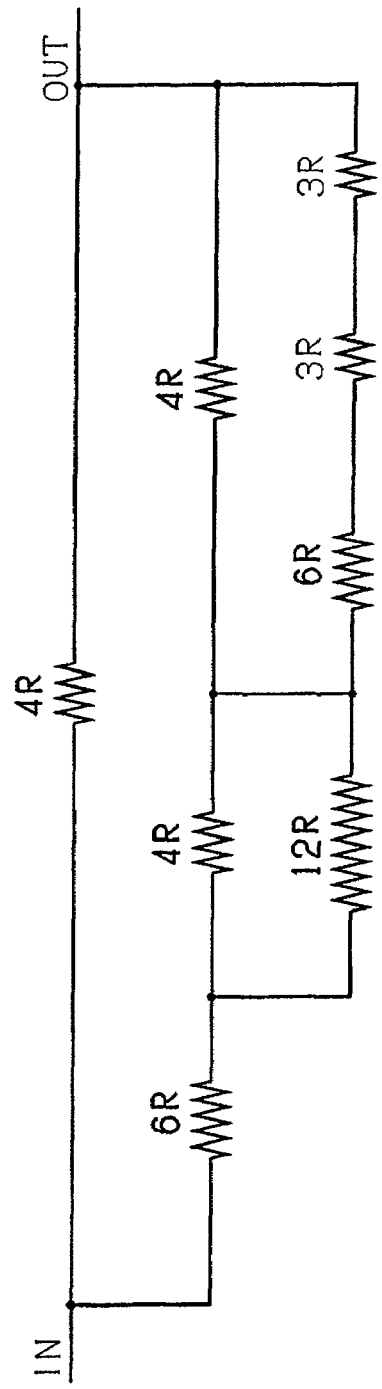
FIG. 4C shows a resistor ladder circuit that is expanded based on the parallel circuit shown in FIG. 4B.
Figure 5A:
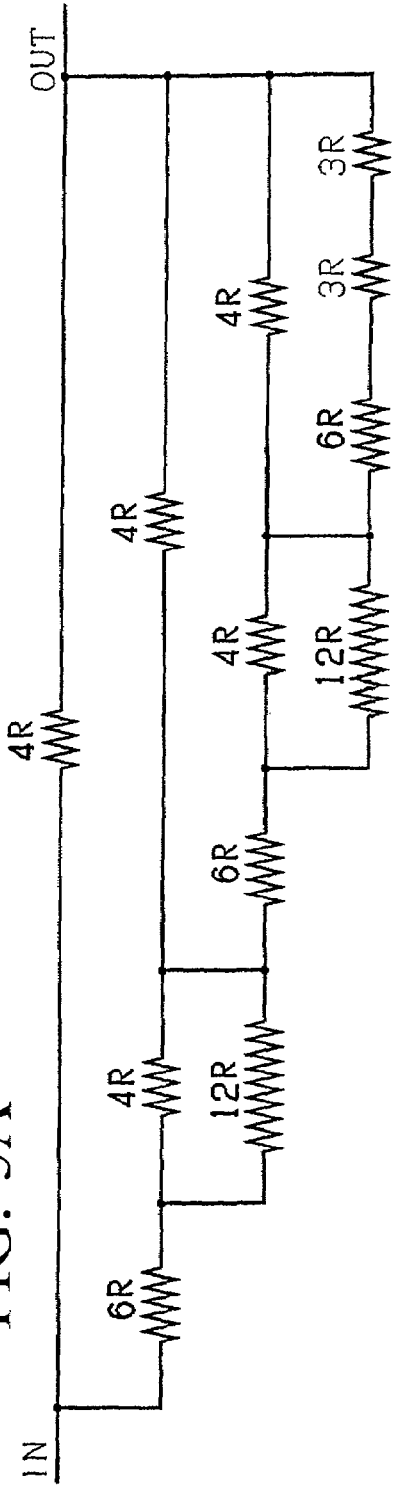
FIG. 5A shows an expanded form of the resistive ladder circuit that is expanded based on the resistive ladder circuit shown in FIG. 4C.
Figure 5B:
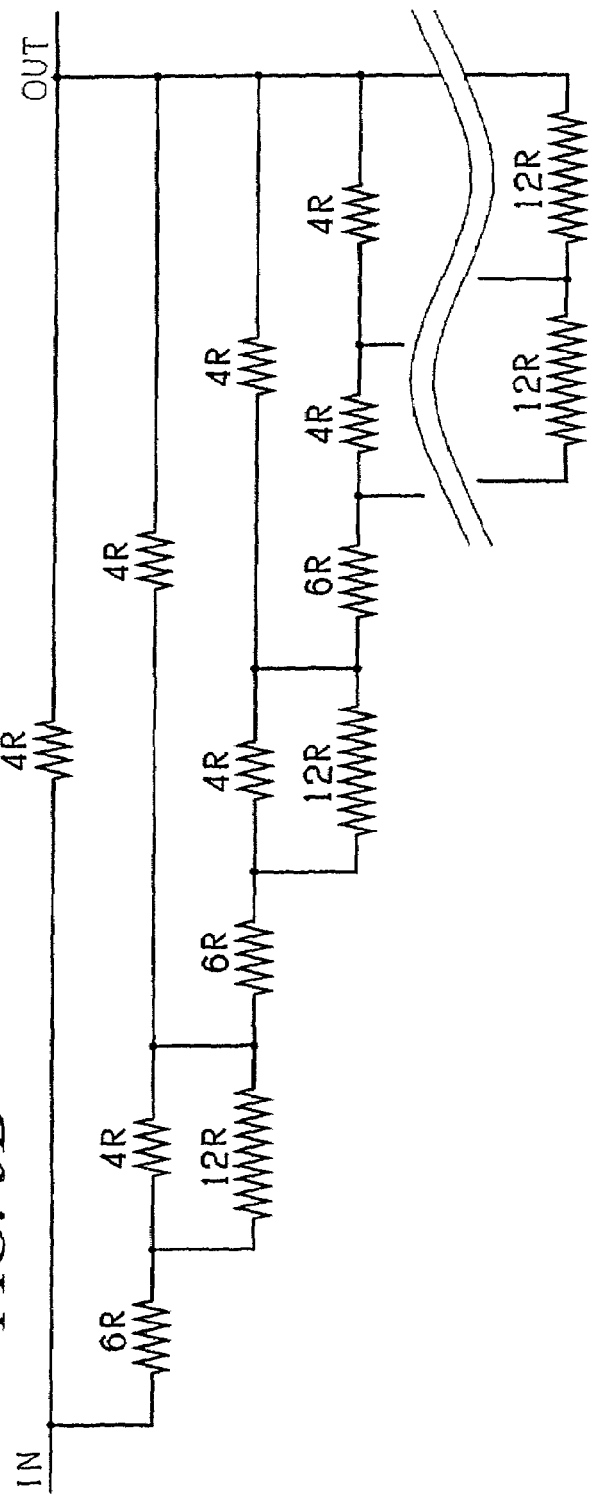
FIG. 5B shows a complex form of the resistive ladder circuit that is further expanded based on the resistive ladder circuit shown in FIG. 5A.

In FIG. 4B, the resistance 6R remains without being expanded while a second resistance dividing operation is performed with respect to the two resistances 3R respectively. Thus, it is possible to produce a resistive ladder circuit shown in FIG. 4C, wherein a resistance 3R is expanded in the form of a parallel circuit consisting of a resistance '4R' and a resistance '12R', while the other is expanded in the form of a parallel circuit in which a resistance '4R' is connected in parallel with a series resistance consisting of a resistance '6R' and two resistances '3R'. Then, a third resistance dividing operation is performed with respect to the two resistances 3R arranged in the side of the terminal OUT. Thus, it is possible to produce a 'complex' resistive ladder circuit shown in FIG. 5A. By performing the aforementioned resistance dividing operation a certain number of times, it is possible to finally produce a 'further complex' resistive ladder circuit shown in FIG. 5B. In such a resistive ladder circuit, it is possible to use a relatively large value of resistance (which may range from one-hundred and several tens of ohms to several hundreds ohms) as each of resistances formed between adjoining taps. Therefore, it is possible to provide fine divisions of the volume gain with a sufficiently high precision.

Figure 6:
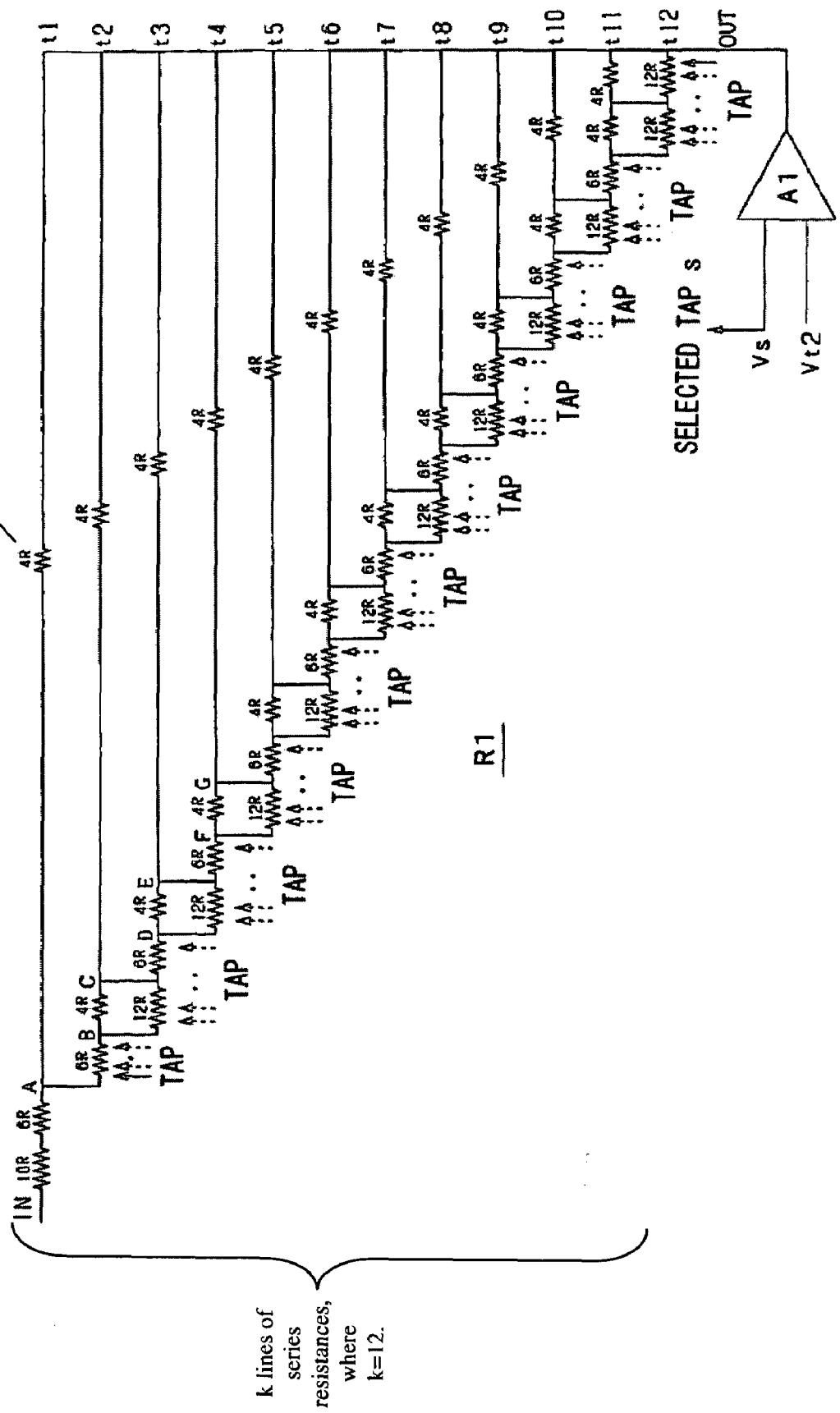
FIG. 6 shows a concrete example of resistive ladder circuits R1 shown in FIGS. 1 and 2.
Figure 7A:
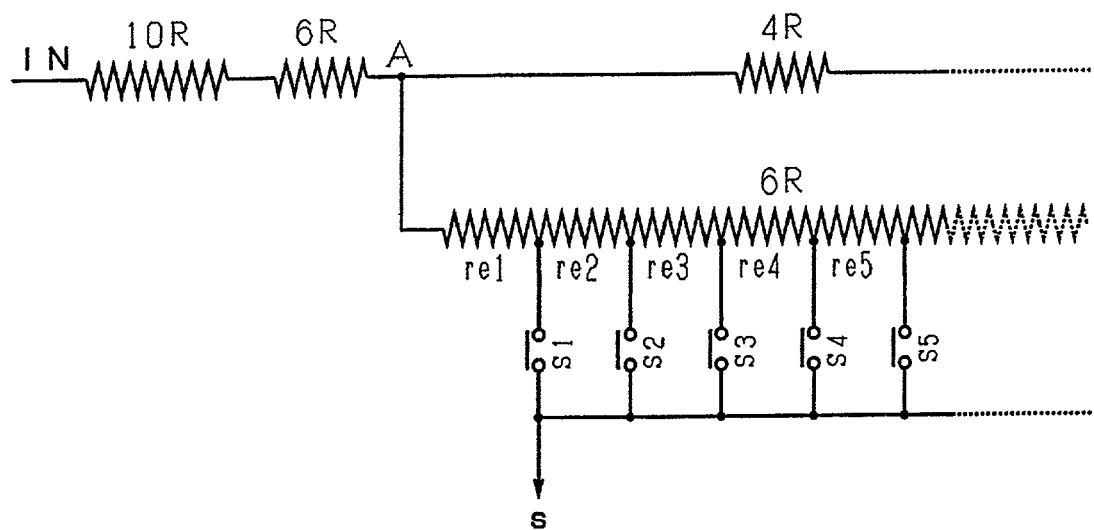
Figure 7B:
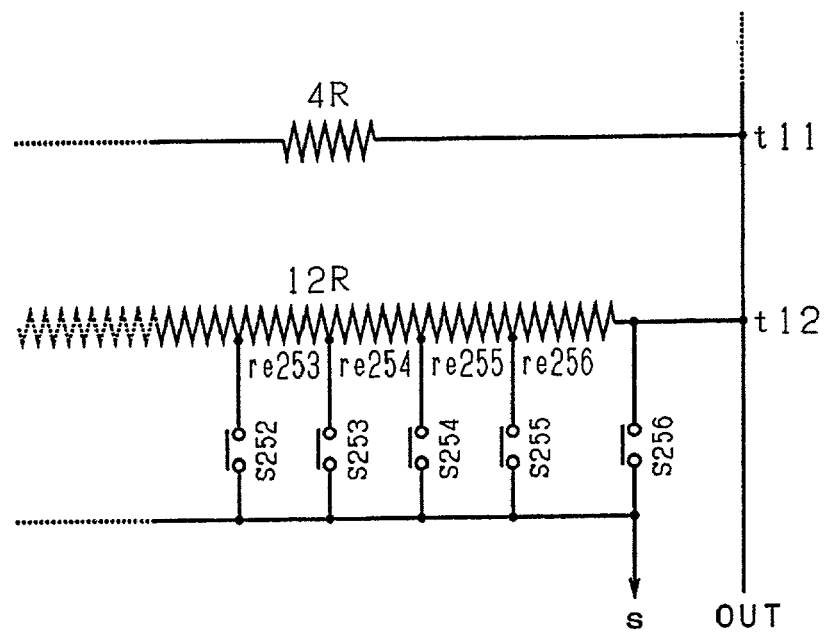
FIG. 7B shows a terminal portion of the resistive ladder circuits R1 in the side of the terminal OUT.

FIG. 6 shows an example of the detailed circuit configuration of the resistive ladder circuits R1 (see FIGS. 1 and 2) realized by numerous resistance elements arranged in the electronic volume circuit of the first embodiment. FIG. 7A shows a detailed circuit configuration of the resistive ladder circuit in proximity to the terminal IN; and FIG. 7B shows a detailed circuit configuration of the resistive ladder circuit in proximity to the terminal OUT. Similarly to FIGS. 4A-4C and FIGS. 5A-5B, the resistive ladder circuits R1 shown in FIG. 6 are produced under the precondition where the division index n is set to '4', and the element resistance R is set to 632Ω, so that the overall resistance of the resistive ladder circuits R1 between the terminals IN and OUT is equal to 19R (=12.008 kΩ).

The resistive ladder circuits of FIG. 6 is constituted by twelve lines of series resistances, wherein resistances 10R, 6R, and 4R are connected in series in the first line; a resistance 6R and two resistances 4R are connected in series in the second line; a resistance 12R, a resistance 6R, and two resistances 4R are connected in series in the third line; . . . ; two resistors 12R are connected in series in the twelfth line. Taps are arranged along the resistance 6R in the second line, resistances 12R and resistances 6R in the third to eleventh lines, and two resistors 12R in the twelfth line, respectively. These taps are connected with '256' switching elements S1-S256 respectively. The switching elements are selectively turned on in response to the volume control data Sv, which designates each of '256' steps of the gain divided by the prescribed interval of 0.5 dB, wherein the maximal gain is set to −16 dB. Therefore, the gain is counted from the maximal gain and can be reduced by each interval. The fractional voltage output s is provided at the tap selected by the switching element that is turned on in response to the volume control data Sv.

The resistive ladder circuit includes k lines of series resistances due to dividing performed a prescribed number of times. The resistive ladder circuit of FIG. 6 is constituted of twelve lines of series resistances, where k=12. In accordance with the principles of resistive ladders, the expansion of the resistive circuit network, and FIGS. 3 to 5, the first line of series resistances includes a resistance nR where n=4, and the resistance nR is connected in parallel with second to twelfth lines of series resistances, the equivalent resistance of which is n(n−1)R where n=4. In addition, the second line of series resistances includes a resistance nR where n=4, and the resistance nR is connected in parallel with the third to twelfth lines of series resistances, the equivalent resistance of which is n(n−1)R where n=4. Similarly, each of the third, fourth, fifth, . . . , and eleventh lines of series resistances includes a resistance nR where n=4, and the resistance nR is connected in parallel with its following lines, the equivalent resistance of which is n(n−1)R where n=4.

Concrete examples of components of the resistive ladder circuits R1 in the side of the terminal IN will be described with reference to FIG. 7A. The terminal IN is connected with a series of resistances 10R, 6R, and 4R in the first line of the resistive ladder circuits R1, wherein the total resistance of these resistances is set to 10.112 kΩ. A resistance 6R of the second line branches out from a connection point 'A' between the resistances 6R and 4R, so that it is connected in parallel with the resistance 4R of the first line. The resistance 6R of the second line is connected with plural switching elements S1, S2, S3, S4, . . . That is, the resistance 6R is divided into plural tap resistances re1, re2, re3, re4, re5, . . . , which will be described below.

re1: 1012.9Ω [between the connection point A and the switching element S1 (−16 dB)]
re2: 319.7Ω [between the switching elements S1-S2 (−16.5 dB)]
re3: 306.4Ω [between the switching elements S2-S3 (−17 dB)]
re4: 293.4Ω [between the switching elements S3-S4 (−17.5 dB)]
re5: 280.8Ω [between the switching elements S4-S5 (−18 dB)]

Concretely speaking, the resistance 6R of the second line is connected with eleven switching elements S1-S11, wherein tap resistance re11 between the switching elements S10-S11 is set to 212.8Ω. In addition, resistance re12' that lies between the switching element S11 and a connection point between the resistance 6R and its adjacent resistance 4R in the second line is 138.6Ω. A resistance 12R of the third line branches out from the connection point B between the resistances 6R and 4R of the second line, wherein it is connected in series with a resistance 6R in the third line. In the third line, the resistance 12R is connected with switching elements S12-S24, and the resistance 6R is connected with switching elements S25-S36. Resistance re12" that lies between the connection point B and the switching element S12 is 257Ω, and tap resistance re13 that lies between the switching elements S12-S13 is 772.7Ω. Similar to the first line, the other tap resistances (i.e., re14, re15, . . . ) in the third line are gradually reduced.

Similar to the third line, the fourth to eleventh lines each contain a series of resistances 12R and 6R, detailed description of which will be omitted. In summary, each of the resistances 6R and/or the resistances 12R in the second to twelfth lines can be limited in certain tap resistances, which range from one-hundred and several tens of ohms to several hundreds of ohms.

Concrete examples of components of the resistive ladder circuits R1 in the side of the terminal OUT will be described with reference to FIG. 7B. The 256th switching element S256 is connected with the terminal OUT of the resistive ladder circuits R1. The twelfth line of the resistive ladder circuits R1 consists of two resistances 12R, along which plural taps are arranged and are respectively connected with switching elements S255, S254, S253, . . . , which are counted from the side of the terminal OUT. That is, the resistance 12R is divided into plural tap resistances re256, re255, re254, re253, . . . , which will be described below.

re256: 1470Ω [between the switching elements S256 (−∞) and S255 (−143.5 dB)]
re255: 199.5Ω [between the switching elements S255-S254 (−143 dB)]
re254: 211.3Ω [between the switching elements S254-S253 (−142.5 dB)]
re253: 223.8Ω [between the switching elements S253-S252 (−142 dB)]

Figure 8:
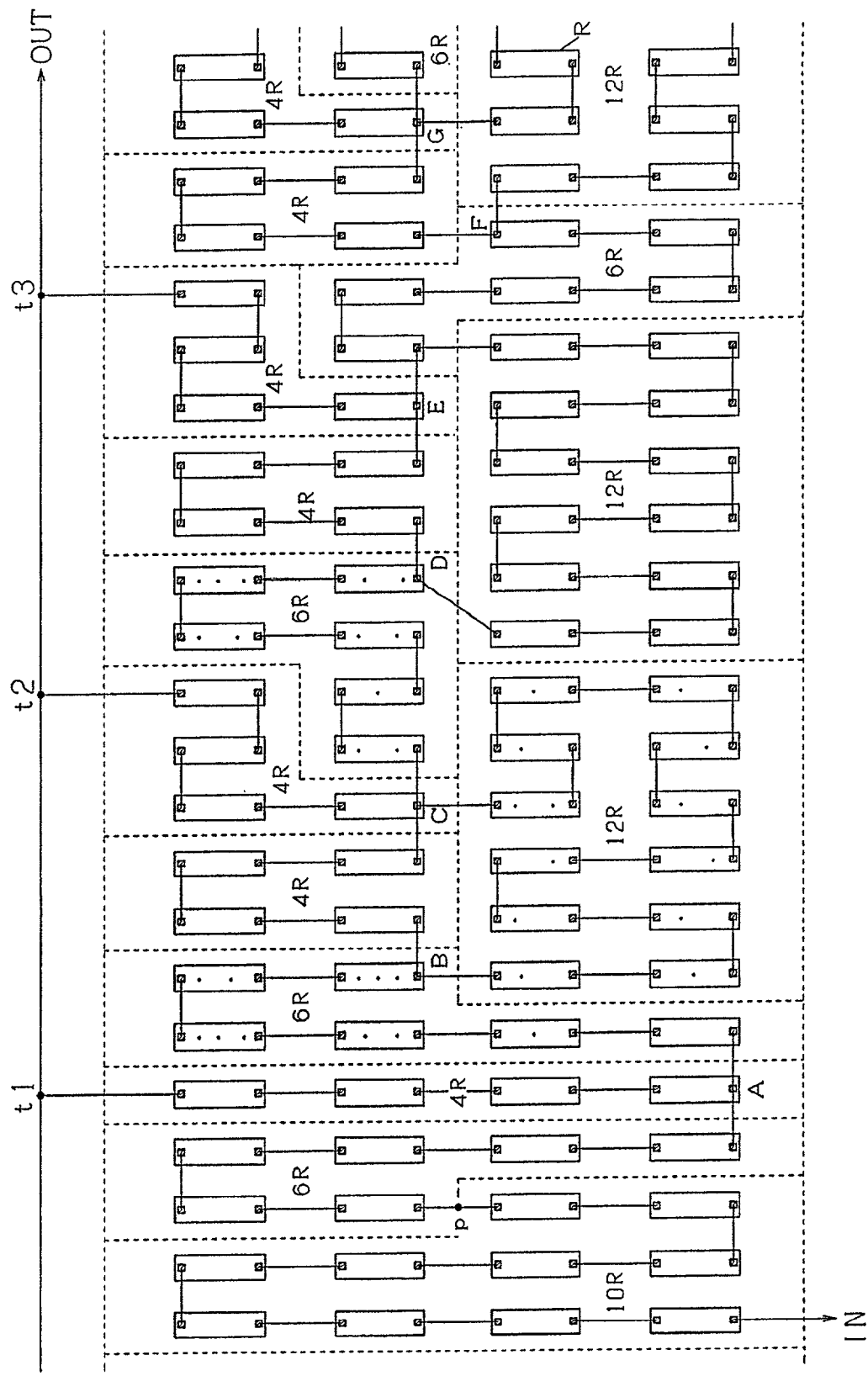
FIG. 8 shows an example of the arrangement and wiring of element resistors for actualizing the resistive ladder circuits shown in FIG. 6.

In the above, tap resistances range from one-hundred and several tens of ohms to several hundreds ohms; therefore, it is possible to obtain a desired volume gain with a high precision. FIG. 8 shows an example of the arrangement and wiring of element resistors, which are connected together in the form of resistive ladder circuits. The arrangement and wiring of element resistors are actualized under the condition where the division index n is set to '4', which have been described before in conjunction with FIGS. 4A-4C, FIGS. 5A-5B, FIG. 6, and FIGS. 7A-7B. Numerous element resistors 'R' (where R=632Ω) are formed in polysilicon resistive films on the LSI circuit board (B1), wherein they are regularly arranged in four lines and are adequately connected together by leads to implement a part of the wiring shown in FIG. 6. Arrangements of element resistors are divided into various units (encompassed by dotted lines), each of which realizes a certain resistance value. For example, the leftmost unit of element resistors connected together by leads realizes a resistance '10R', and its next unit of element resistors realizes a resistance '6R'. Therefore, various units of element resistors are arranged to realize various resistance values such as 10R, 6R, 4R, and 12R. Taps (designated by dots in FIG. 6) are arranged with respect to the prescribed units of element resistors realizing the resistances '6R' and '12R'. These taps are interconnected with switching elements of the switch circuit SW via leads (not shown). Since the resistive ladder circuits R1 are actualized by arranging and connecting element resistors R, they can be easily manufactured.

Second Embodiment

Figure 9:
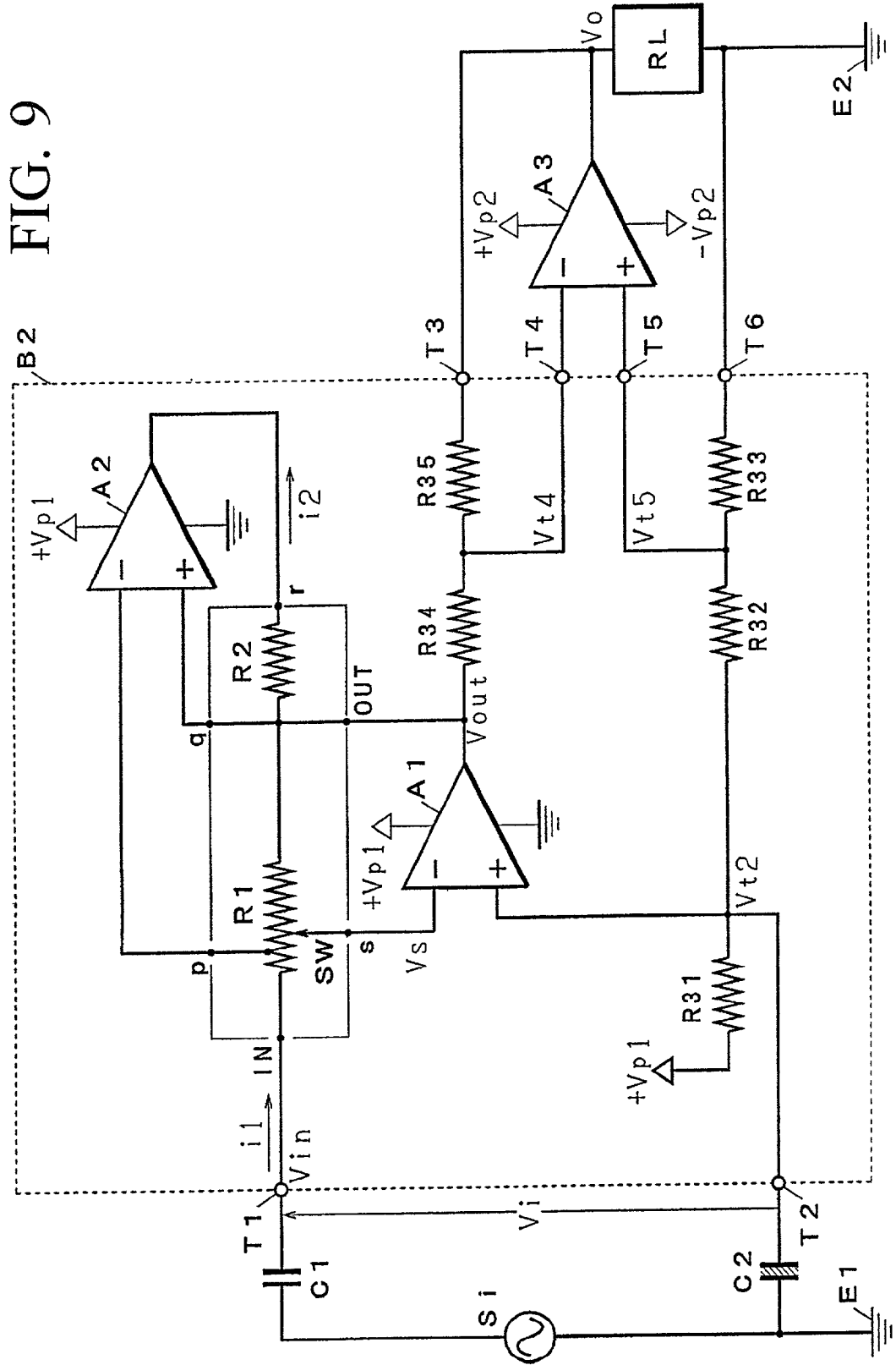
FIG. 9 is a circuit diagram showing an overall configuration of an electronic volume circuit in accordance with a second embodiment of the invention.

FIG. 9 shows the overall configuration of an electronic volume circuit in accordance with a second embodiment of the invention, wherein parts and components identical to those shown in FIG. 1 will be designated by the same reference symbols and numerals. The electronic volume circuit of the second embodiment shown in FIG. 9 provides an LSI circuit B2 that contains secondary resistive ladder circuits R2 and a secondary inversion-type operational amplifier A2, which operates by the source voltage +Vp1, in addition to the resistive ladder circuits R1 and the operation amplifier A1. Due to the provision of the secondary resistive ladder circuits R2 and the secondary operation amplifier A2, the LSI circuit B2 additionally provides current control functions and wiring resistance cancellation functions compared with the LSI circuit B1 shown in FIG. 1. FIG. 9 merely shows an equivalent circuit for representation of series connections between the resistive ladder circuits R1 and R2. The resistive ladder circuits R1 and R2 (encompassed in a block as if two resistors are connected in series) have a terminal IN that matches an input terminal of the resistive ladder circuits R1, and an terminal OUT that matches a connection point between the resistive ladder circuits R1 and R2. In addition, the fractional voltage output s is extracted from the resistive ladder circuits R1 via a certain tap and is supplied to the inverting input terminal of the operational amplifier A1. With respect to the operational amplifier A2, the inverting input terminal corresponds to a certain point of the resistive ladder circuits R1; the noninverting input terminal corresponds to the connection point between the resistive ladder circuits R1 and R2; and the output terminal corresponds to the other end 'r' of the resistive ladder circuits R2. In the case where n=4, the total resistance of the resistive ladder circuits R1 (lying between IN and q) is 12.008 kΩ, and the total resistance of the resistive ladder circuits R2 (lying between q and r) is 200Ω.

In the above, a gain α of the operational amplifier A2 is given by the following equation using reference symbols Rpq and Rqr, where 'Rpq' denotes a partial resistance of the resistive ladder circuits R1 between p and q, and 'Rqr' denotes the overall resistance of the resistive ladder circuits R2 between q and r.

$$\alpha = \frac{Rqr}{Rpq} \quad (11)$$

With respect to a current i1 that flows from the input terminal T1 into the resistive ladder circuits R1, a voltage Vpq measured between p and q is given by the following equation.

$$Vpq = i1 \times Rpq \quad (12)$$

With respect to a current i2 that flows into the output terminal of the operational amplifier A2 through the resistive ladder circuits R2, a voltage Vrq measured between r and q is given by the following equation.

$$Vrq = -i2 \times Rqr \quad (13)$$

The output voltage of the operational amplifier A2 matches the voltage Vrq measured between r and q, and it is calculated using the equation (11) as follows:

$$Vrq = -\alpha \times Vpq = -\left(\frac{Rqr}{Rpq}\right) \times Vpq \quad (14)$$

Through the aforementioned equations (12) to (14), it is possible to produce the following relationship.

$$-i2 \times Rqr = -\left(\frac{Rqr}{Rpq}\right) \times i1 \times Rpq$$

That is, it is possible to set the relationship of 'i2=i1'.

In other words, the current i1 flowing from the input terminal T1 is forced to match with the current i2 that may flow towards the output terminal of the operational amplifier A2. Thus, it is possible to perform feed-forward current controls in such a way that most of the current flowing into the input terminal T1 is substantially absorbed by the operational amplifier A2. This prevents unwanted currents from flowing into the operational amplifier A1; therefore, it is possible to realize high-precision volume level controls by using the operational amplifier A1.

Next, a description will be given with respect to wiring resistance cancellation functions of the LSI circuit B2 shown in FIG. 9. Suppose that the aforementioned resistive ladder circuits R1 provide a fractional voltage output s that is specifically used for volume level controls. It may be understood from the illustration of FIG. 8 that relatively long lines should be wired between output terminals (t1-t12) of respective lines of resistive ladder circuits R1 and the terminal OUT. This causes wiring resistances Rm that may not be negligible.

Figure 10A:
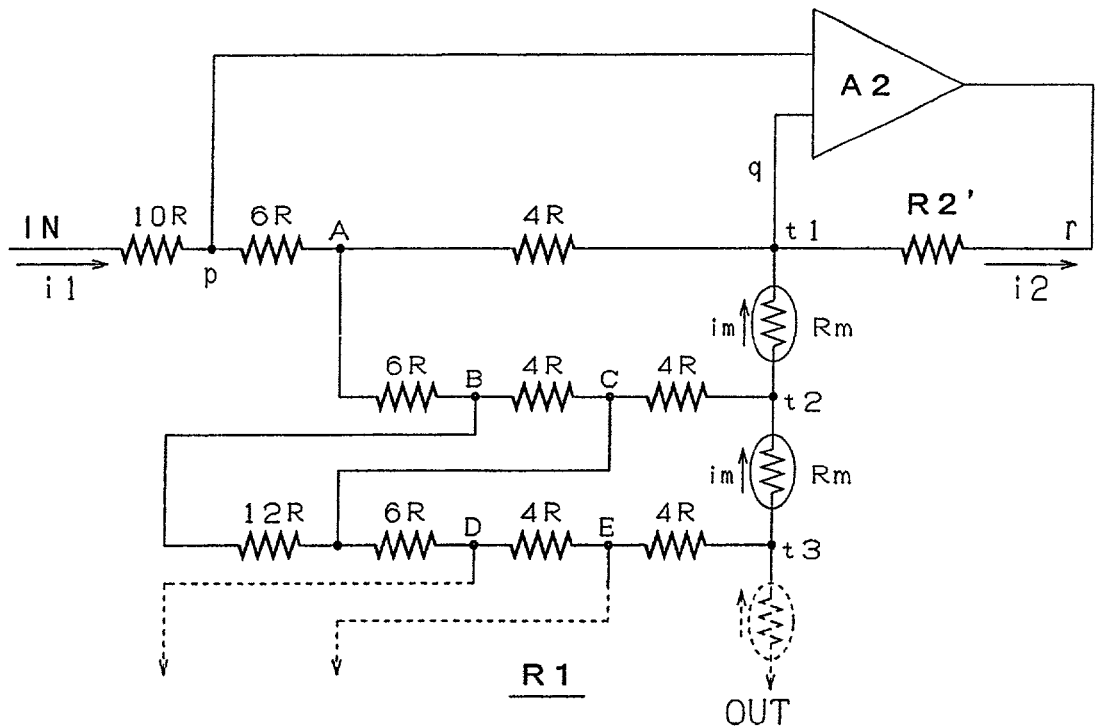
FIG. 10A shows a terminal portion of resistive ladder circuits R1 and R2 shown in FIG. 9, which are used to explain influences due to wiring resistances.

Next, a description will be given with respect to influences of wiring resistances Rm in the resistive ladder circuits R1 (see FIG. 6) providing the fractional voltage output s. Herein, it is possible to provide a solution as shown in FIG. 10A in which the output terminal t1 of the first line of the resistive ladder circuits R1 is connected to the output terminal of the operational amplifier (A2) via a current absorption control resistance R2'. However, this solution may cause a problem in that potential differences occur between adjoining output terminals (i.e., t1-t2, t2-t3, t3-t4, . . . ) due to wiring resistances Rm therebetween. Potential differences may badly influence the gain of the operational amplifier A1. When the wiring resistance Rm is relatively large, the electronic volume circuit may be incapable of accurately limiting the gain thereof down to the 'desired' minimal gain (e.g., −143 dB).

Figure 10B:
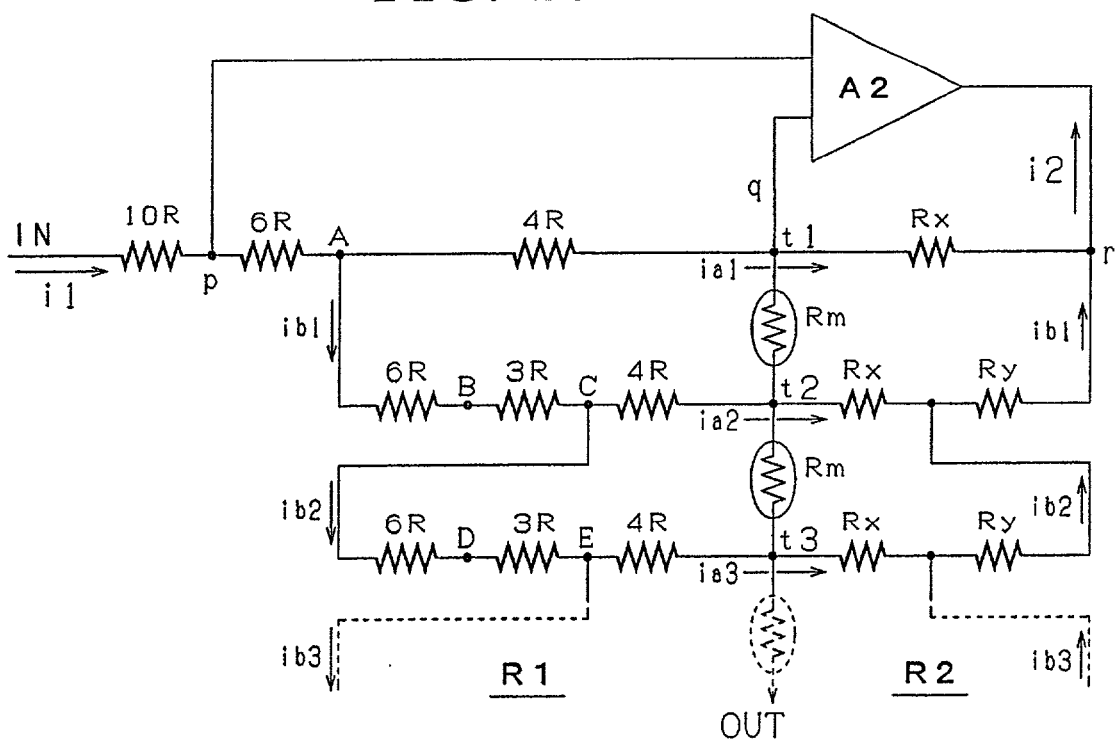
FIG. 10B shows a terminal portion of resistive ladder circuits R1 and R2, which are modified to cancel influences due to wiring resistances.

The second embodiment is characterized by reconstructing the resistive ladder circuits R2 as shown in FIG. 10B, wherein the resistive ladder circuits R2 can provide current control functions as well as wiring resistance cancellation functions. That is, the output terminals t1, t2, t3, . . . of the resistive ladder circuits R1 that may provide the fractional voltage output s are respectively connected with cancellation resistors Rx, which are followed by other cancellation resistors Ry. These resistors Rx and Ry are adequately set in resistances to provide the same potential with respect to each of the output terminals t1, t2, t3, . . . of the resistive ladder circuits R1. The circuitry of FIG. 10B is partially modified using equivalent circuits compared with the circuitry of FIG. 10A in such a way that each parallel circuit consisting of resistances 4R and 12R is replaced by a resistance 3R.

The details of the circuitry of FIG. 10B will be described under the condition where n=4. Due to the current control (or absorption) function of the operational amplifier A2, the current i1 input from the input terminal T1 is forced to match with the current i2 that flows into the output terminal of the operational amplifier A2, wherein i1=i2. When each of the output terminals t1, t2, t3, . . . is set to the same potential, no current may flow through the wiring resistance Rm, which is established between adjoining terminals (i.e., t1-t2, t2-t3, t3-t4, . . . ). Hence, terminal currents ia1, ia2, ia3, . . . that flow through the output terminals t1, t2, t3, . . . directly flow through the cancellation resistors Rx, which are connected to the output terminals t1, t2, t3, with respect to the respective lines of the resistive ladder circuits R1.

With respect to the second line, a series of resistances 6R and 9R (i.e., series resistance '9R' in total) derive from a connection point A in the first line. With respect to the third line, a series of resistances 6R and 3R (i.e., series resistance '9R' in total) derive from a connection point B in the second line. Similarly, series resistance '9R' in the fourth line (not shown) derives from a connection point E in the third line. That is, each of following lines contains series resistance '9R' that derives from each of preceding lines. Shunt currents ib1, ib2, ib3, . . . are forced to flow through the series resistances '9R' in the respective lines of the resistive ladder circuits R1, wherein they are identical to currents that flow through the cancellation resistors Ry in the resistive ladder circuits R2. Ratios between terminal currents and shunt currents, i.e., ia1/ib1, ia2/ib2, ia3/ib3, . . . , are all equal to '3'. Generally speaking, the ratio between the terminal current and shunt current is expressed as 'n−1' (where 'n' denotes the division index).

With respect to the first and second lines of the resistive ladder circuits, for example, the following equations are established.

$$ia1 = 3 \times ib1 \qquad (a)$$

$$4R \times ia1 = 9R \times ib1 + 4R \times ia2 \qquad (b)$$

$$Rx \times ia1 = Rx \times ia2 + Ry \times ib1 \qquad (c)$$

From the equations (a) and (b), it is possible to produce the following equation.

$$ia1 = 4 \times ia2 \qquad (d)$$

Hence, it is possible to produce the following equation based on the equations (a), (c), and (d).

$$\frac{Rx}{Ry} = \frac{4}{9} \qquad (15)$$

It may be obvious by the comparison between the left and right portions of the circuitry of FIG. 10B that the resistive ladder circuits R2 have the symmetrical circuit configuration compared with the resistive ladder circuits R1 with respect to the output terminals t1-t12 and the terminal OUT. Due to such symmetry, it is possible to provide the same potential with respect to each of the output terminals t1-t12 and the terminal OUT; hence, it is possible to cancel influences of wiring resistances Rm, regardless of their values.

Due to the aforementioned symmetry, it is possible to easily determine circuit constants and parameters with respect to the resistive ladder circuits R2, which may realize the overall resistance 'R2e', for example. That is, in the case of the circuitry of FIG. 10B where n=4, the element resistance R is determined as follows:

$$R = \frac{R2e}{n-1} = \frac{R2e}{3}$$

When R2e=200Ω, the element resistance R is calculated as follows:

$$R = \frac{R2e}{3} = \frac{200}{3} = 66.7 \ \Omega$$

Hence, the cancellation resistances Rx and Ry can be calculated as follows:

$$Rx = n \times R = 4 \times 66.7\Omega = 266.7\Omega$$

$$Ry = Rx \times 4/9 = 200 \times 3 = 600\Omega$$

As described before in conjunction with FIGS. 3A-3B, FIGS. 4A-4C, FIGS. 5A-5B, and FIG. 6, the comprehensive equivalent resistance of the following lines in view of the cancellation resistance Rx in each line can be calculated as follows:

$$n \times (n-1) \times R = 4 \times 3 \times R2e/3 = 800\Omega$$

Figure 12:
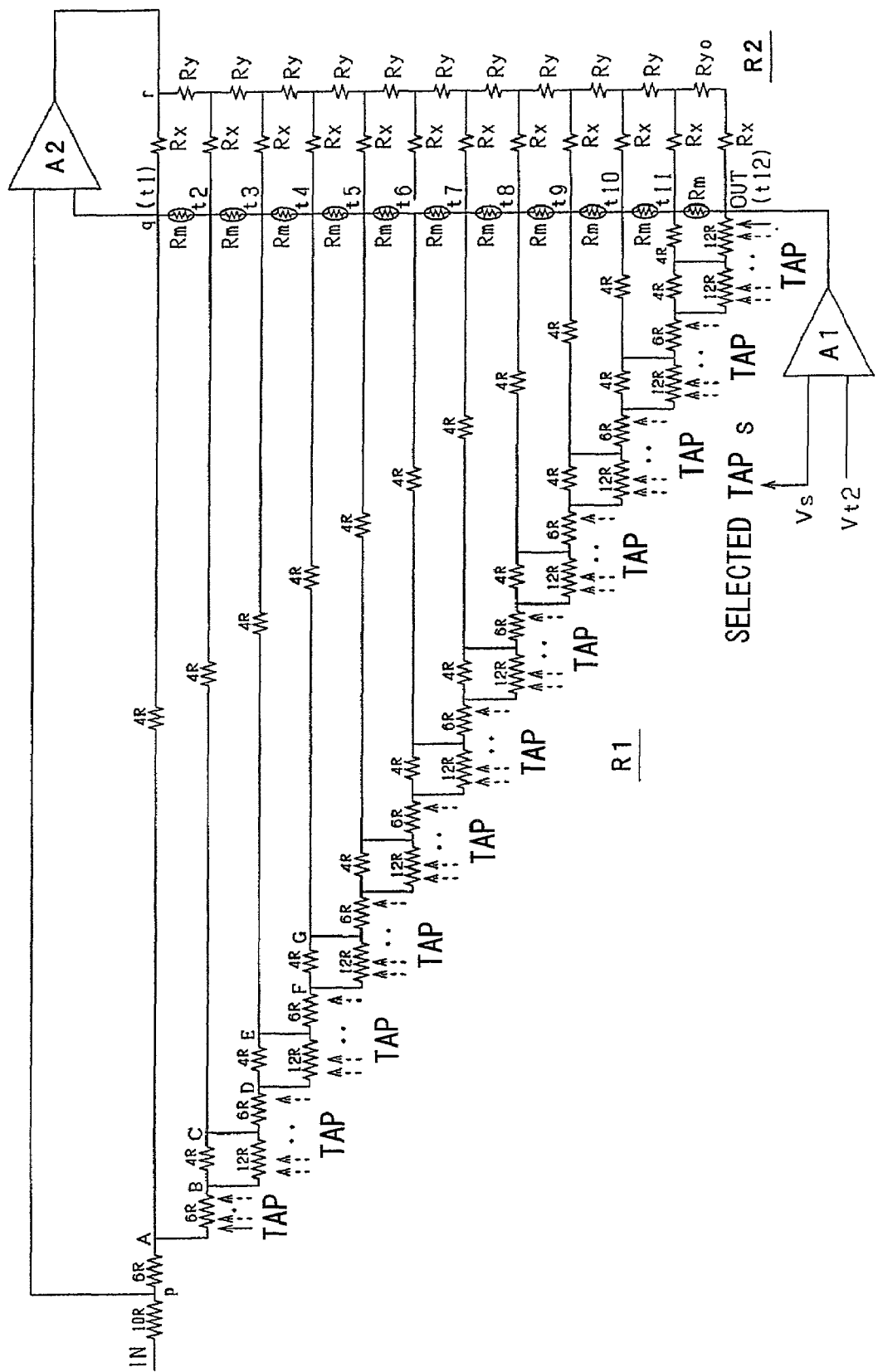
FIG. 12 shows a concrete example of the resistive ladder circuits R1 and R2 that are connected in series.

With respect to the output terminal of the last line (i.e., terminal t12 of the twelfth line shown in FIG. 6), the foregoing resistance dividing operation would no longer be required. As shown in FIG. 12, a series of resistances Rx and Ryo are inserted in connection with the other end of the cancellation resistance Rx in the eleventh line, wherein the resistance Ryo is calculated as follows:

$$Ryo = 800\Omega - 266.7\Omega = 533.3\Omega$$

In summary, in the case of the circuitry of FIG. 10B where n=4, it is possible to provide the following equations with respect to the resistive ladder circuit R2 having the overall resistance R2e (where 'Ryo' and '12R' are shown in FIG. 12).

$$\frac{Rx}{Ry} = \frac{4R}{6R+3R}$$

$$\frac{Rx}{Rx+Ryo} = \frac{4R}{12R}$$

$$Rx+Ryo=4\times R2e$$

Figure 11:
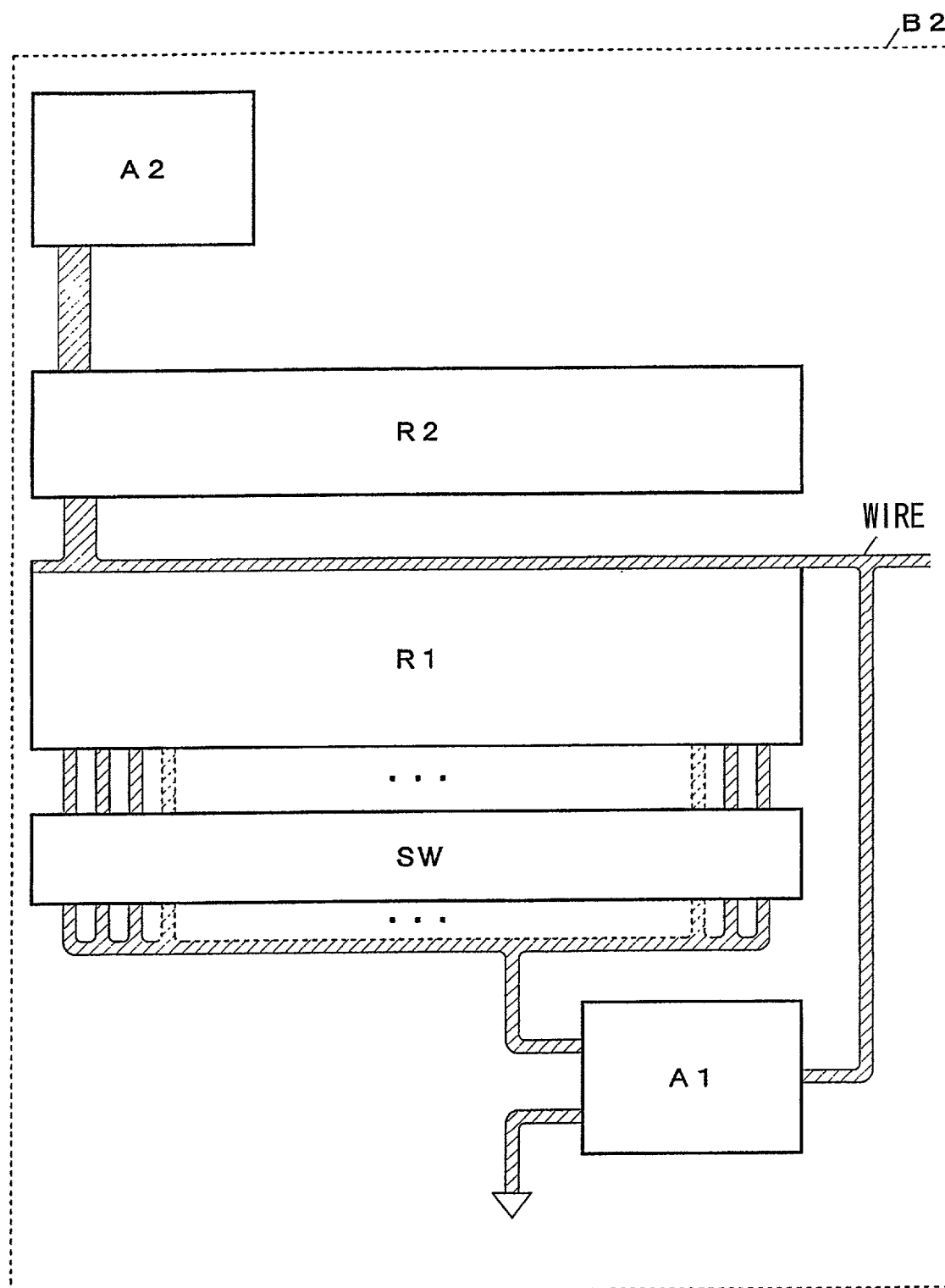
FIG. 11 shows an example of the overall layout of an LSI circuit realizing the electronic volume circuit of the second embodiment.

FIG. 11 shows an example of the overall layout of an LSI circuit representing the electronic volume circuit of the second embodiment. FIG. 12 shows an example of the overall configuration of the resistive ladder circuits R1 and R2 that are connected in series in accordance with the second embodiment. Herein, the configuration of the resistive ladder circuits R1 is designed under the same conditions for use in the design of the first embodiment.

Next, the overall operation of the electronic volume circuit of the second embodiment will be briefly described in conjunction with FIG. 12. That is, the input signal voltage Vi input to the terminal IN is converted to the voltage Vout having an amplitude that substantially matches the fractional voltage output s extracted from the prescribed tap of the resistive ladder circuits R1 under the operation of the first amplifier (or attenuator) A1, so that the voltage Vout is output to the terminal OUT. In FIG. 12, a resistance 4R is arranged in each of second to eleventh lines of resistive ladder circuits R1 that lie between the terminals IN and OUT (see FIG. 9). Herein, the resistance 4R in one line is connected in parallel with the resistance 12R in the next line. The equivalent resistance viewed from both ends of the resistance 4R in each line is made equal to 3R, which is the original resistance of the series circuit. Herein, resistance values are adjusted in such a way that they become larger as the number of line becomes larger. Hence, it is possible to provide the 'desired' fractional voltage output with a high resolution.

The secondary resistive ladder circuits R2 are introduced to control the second amplifier A2 that operates to absorb the current flowing into the resistive ladder circuits R1, wherein the secondary resistive ladder circuits R2 are constituted symmetrically with the resistive ladder circuits R1. This provides the same potential with respect to all the output terminals t1 to t12 of the resistive ladder circuits R1; hence, it is possible to eliminate unwanted influences due to wiring resistances Rm, which are formed between adjoining output terminals within the output terminals t1 to t12. That is, the second embodiment introduces the resistive ladder circuits R1 for use in the extraction of the fractional voltage output, and the resistive ladder circuits R2 for use in current controls. Thus, it is possible to provide an electronic volume circuit having a high resolution in fine adjustments of the volume.

As described heretofore, this invention provides a variety of effects and technical features, which will be described below.

(1) The volume circuit of this invention is designed such that the fractional voltage output Vs is extracted from the prescribed tap of the resistive ladder circuits R1 by the switch circuit SW. The resistive ladder circuits R1 are constituted by multiple lines of series resistances, wherein numerous element resistors are connected in series and in parallel between the terminals IN and OUT. Each line is connected in parallel with a series resistance that is 'n' times larger than the element resistance 'R', so that the comprehensive overall resistance of the following lines is increased '(n−1)×n' times larger than the element resistance 'R'.

(2) The total equivalent resistance in view of the resistance 'nR' in one line becomes '(n−1)' times larger than the element resistance 'R'. Therefore, the second line of the resistive ladder circuits arranges taps among series resistances 'n(n−1)R' that are 'n' times larger than the original overall resistance '(n−1)R'. Thus, it is possible to provide 'desired' fractional voltage output with a very high precision, which is 'n' times greater than that of the first line. In addition, the third line arranges taps with a very high precision (or resolution), which is 'n' times greater than that of the second line. That is, this invention can increase the precision (or resolution) in providing the fractional voltage output (or in selecting the prescribed tap) exponentially as the number of lines of resistive ladder circuits becomes large.

(3) The volume circuit of this invention can introduce combinations of resistive ladder circuits and amplifiers, wherein the resistive ladder circuits R1 are specifically used for providing the fractional voltage output, and the other resistive ladder circuits R2 are used to control currents flowing in the resistive ladder circuits R1. The resistive ladder circuits R1 have multiple lines of series resistances between the terminals IN and OUT, wherein one line is partially connected in parallel with the next line in connection with the 'common' terminal OUT. The fractional voltage Vs extracted from the resistive ladder circuits R1 is input to the first amplifier A1, the output terminal of which is connected to the terminal OUT. The input terminal 'q' of the second amplifier A2 is connected to the terminal OUT. In addition, the resistive ladder circuits R2 are inserted between the terminal OUT and the output terminal 'r' of the second amplifier A2.

(4) Due to the provision of the second amplifier A2 and the resistive ladder circuits R2, the current that flows from the terminal IN into the resistive ladder circuits R1 is absorbed by the output terminal of the second amplifier A2. In addition, the resistive ladder circuits R2 perform current controls in such a way that the output terminals t1-t12 of the resistive ladder circuits R1 are all set to the same potential, which prevents the current from flowing between wires interconnecting the output terminals t1-t12 together. Thus, it is possible to eliminate unwanted influences due to wiring resistances Rm, which emerge between adjoining output terminals.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A volume circuit comprising:
a first resistive ladder circuit including 'k' lines of first series resistances connected in parallel between an input terminal and an output terminal, wherein 'k' is an integer that is not less than 2, and a desired fractional output is extracted from a prescribed point in the 'k' lines of the series resistances;

a first amplifier for amplifying the desired fractional output extracted from the first resistive ladder circuit, wherein an output terminal of the first amplifier is connected to the output terminal of the first resistive ladder circuit;

a second amplifier having a first input terminal connected to a prescribed output-side point of the first resistive ladder circuit and a second input terminal connected to a prescribed input-side point of the first resistive ladder circuit; and a second resistive ladder circuit, including 'k' lines of second series resistances connected in parallel, and which is connected in series to the first resistive ladder circuit and is connected to an output terminal of the second amplifier.

2. A volume circuit according to claim 1, wherein the first resistive ladder circuit and the second resistive ladder circuit are constituted symmetrically with respect to the output of the first resistive ladder circuit.

3. A volume circuit according to claim 1, wherein each of the 'k' lines of the series resistances has a resistance that is one of predetermined integer numbers times larger than an element resistance 'R', said 'k' is an integer that is not less than 2, a resistance 'nR' forming a part of the series resistances of a line having a number 'i' within the 'k' lines of series resistances is connected in parallel to the series resistances of at least one line having a number not less than 'i+1' and having an equivalent resistance of 'n(n−1)R', said 'n' is an integer that is not less than 2, and said 'i' is an integral number selected from among prescribed integral numbers ranging from 1 to 'k−1', whereby an equivalent resistance of '(n−1)R' is realized by the series resistances of at least two lines having numbers that are 'i' or more.

4. A volume circuit according to claim 2, wherein each of the 'k' lines of the first and second series resistances has a resistance that is one of predetermined integer numbers times larger than an element resistance 'R', said 'k' is an integer that is not less than two, a resistance 'nR' forming a part of the series resistances of a line having a number 'i' within the 'k' lines of series resistances is connected in parallel to the series resistances of at least one line having a number 'i+1' and having an equivalent resistance of 'n(n−1)R' said 'n' is an integer that is not less than two, and said 'i' is an integral number selected from among prescribed integral numbers ranging from 1 'k−1', whereby an equivalent resistance of '(n−1)R' is realized by the series resistances of at least two lines having numbers that are 'i' or more.

5. A volume circuit according to 1, wherein the first resistive ladder circuit, the second resistive ladder circuit the first amplifier, and the second amplifier are all formed on a same semiconductor substrate.

6. A volume circuit according to 2, wherein the first resistive ladder circuit, the second resistive ladder circuit, the first amplifier, and the second amplifier are all formed on a same semiconductor substrate.

7. A volume circuit according to 3, wherein the first resistive ladder circuit, the second resistive ladder circuit, the first amplifier, and the second amplifier are all formed on a same semiconductor substrate.

8. A volume circuit according to 4, wherein the first resistive ladder circuit, the second resistive ladder circuit, the first amplifier, and the second amplifier are all formed on a same semiconductor substrate.

9. A volume circuit according to claim 1, wherein the first input terminal of the second amplifier is a non-inverting input terminal, and the second input terminal of the second amplifier is an inverting input terminal.

10. A volume circuit comprising:

a resistive ladder circuit including 'k' lines of series resistances between an input terminal and an output terminal, wherein each of the 'k' lines of series resistances has a resistance that is one of predetermined integer numbers times larger than an element resistance 'R', said 'k' is an integer that is not less than 2, a resistance 'nR', forming a part of the series resistances of a line having a number 'i' within the 'k' lines of series resistances, is connected in parallel to the series resistances of at least one line having a number not less than 'i+1'' and having an equivalent resistance of 'n(n−1)R', 'n' is an integer that is not less than 2, and 'i' is an integral number selected from among prescribed integral numbers ranging from 1 to 'k−1', whereby an equivalent resistance of '(n−1)R' is realized by the series resistances of at least two lines having numbers 'i' or more; and a switch circuit for extracting a desired fractional output from the resistive ladder circuit.

11. A volume circuit according to claim 10, wherein each of the series resistances ranging from a line whose number is 2 to a line having a number 'k' within the 'k' lines of the series resistances is equipped with a plurality of taps for extracting the desired fractional output, and wherein the switch circuit selects one of the plurality of taps arranged for the series resistances ranging from the line having a number 2 to the line 'k', thus providing the desired fractional output.

12. A volume circuit according to claim 10, wherein one of the series resistances of a line having a number 'j' within the 'k' lines of series resistances includes a plurality of taps, an other of the series resistances of the line having the number 'j', which does not include the plurality of taps, is connected with the series resistances of a line having a number 'j+1' in parallel, and said 'j' is an integral number selected from among the prescribed integral numbers ranging from 2 to 'k−1'.

13. A volume circuit according to claim 10, further including an amplifier for amplifying the fractional output, which is extracted from the resistive ladder circuit by the switch circuit.

14. A volume circuit according to claim 11, further including an amplifier for amplifying the fractional output, which is extracted from the resistive ladder circuit by the switch circuit.

15. A volume circuit according to claim 12 further including an amplifier for amplifying the fractional output, which is extracted from the resistive ladder circuit by the switch circuit.

16. A volume circuit according to claim 13, wherein the resistive ladder circuit, the switch circuit, and the amplifier are all formed on a same semiconductor substrate.

17. A volume circuit according to claim 14, wherein the resistive ladder circuit, the switch circuit, and the amplifier are all formed on a same semiconductor substrate.

18. A volume circuit according to claim 15, wherein the resistive ladder circuit, the switch circuit, and the amplifier are all formed on a same semiconductor substrate.

* * * * *